United States Patent [19]

Sepponen

[11] Patent Number: 4,743,850

[45] Date of Patent: May 10, 1988

[54] METHOD OF MAPPING THE NUCLEAR MAGNETIC PROPERTIES OF AN OBJECT TO BE EXAMINED

[75] Inventor: Raimo Sepponen, Helsinki, Finland

[73] Assignee: Instrumentarium Corp., Finland

[21] Appl. No.: 97,253

[22] Filed: Sep. 17, 1987

Related U.S. Application Data

[63] Continuation of Ser. No. 738,850, May 29, 1985, abandoned.

[30] Foreign Application Priority Data

Jun. 7, 1984 [FI] Finland ................................. 842292

[51] Int. Cl.$^4$ ............................................ G01R 33/20
[52] U.S. Cl. ..................................... 324/309; 324/307
[58] Field of Search ............... 324/300, 307, 309, 311, 324/312, 313, 314, 318, 322; 128/653

[56] References Cited

U.S. PATENT DOCUMENTS 4,480,228 10/1984 Bottomley ........................... 324/309

Primary Examiner—Michael J. Tokar
Attorney, Agent, or Firm—Andrus, Sceales, Starke & Sawall

[57] ABSTRACT

A method for determining the spatial distribution of an NMR responsive element in a selected volume of an object to be examined and the relaxation time in the rotating frame (T1 $\rho$) of nuclei of the element. An external magnetic field is applied to the selected volume of the object. The nuclei in the selected volume are excited by a first electromagnetic pulse for generating a nuclear magnetization transverse to the direction of the main magnetic field. A second electromagnetic pulse is applied to the selected volume. The second pulse is oscillatory and has a phase selected such that the magnetic component of the pulse is directed parallel to the direction of the processing transverse nuclear magnetization. The relaxation obtained during this second pulse occurs in a rotating reference frame and is characterized by the relaxation time T1 $\rho$. Magnetic field gradient pulses sequenced with said electromagnetic pulses are applied and the NMR signals collected to construct a map containing relaxation tiem in the rotating frame (T1 $\rho$) data.

8 Claims, 5 Drawing Sheets

METHOD OF MAPPING THE NUCLEAR MAGNETIC PROPERTIES OF AN OBJECT TO BE EXAMINED

The present application is a continuation application of U.S. patent application, Ser. No. 738,850, filed May 29, 1985 and now abandoned.

The present invention relates to a method of finding out the local distribution of the relaxation time $T_1\rho$ of nuclear magnetism in the nucleus of an atom to be examined in a three-dimensional object, e.g. a human body or trunk of a tree. The existence of nuclear magnetic resonance phenomenon was established experimentally in 1946 by two research groups (Pound, Purcell, Torrey and Bloch, Hansen, Packard). This discovery quickly led to wide application of the phenomenon in the fields of physics and organic chemistry.

BACKGROUND OF THE INVENTION

All nuclei with odd number of protons or neutrons have an impulse moment or spin different from zero. The nuclei also have a positive electric charge which, together with the spin of the nucleus, produces for the nucleus a magnetic moment whose direction coincides with the spin axis of the nucleus. A field generated by the magnetic moment of a nucleus can be approximated by the field of a magnetic dipole. If a sample containing a plurality of nuclei is placed in a static magnetic field, the magnetic moments of the nuclei tend to align parallel with an external magnetic field and the sample will be provided with a net magnetization parallel to the external magnetic field. The magnitude of the net magnetization is proportional to the number of nuclei in a sample and to the strength of an external magnetic field. The orientation of nuclei is also disturbed by the thermal motion of nuclei, so the magnitude of the magnetization will also be affected by the temperature of a sample: temperature increases, magnetization decreases. In terms of quantum mechanics, the events can be described so that an external magnetic field generates a number of energy levels depending on the spin quantum number (I) of a nucleus, at which levels a nucleus can set with a certain probability. The nucleus of a hydrogen atom or proton has a spin quantum number $I=\frac{1}{2}$, so a proton can settle at two energy levels either in a manner that the direction of its magnetic moment is the same as that of the external magnetic field or reverse to this direction. Of these two, the former is more probable and the occupation proportions of energy levels conform with the so-called Boltzmann distribution. In order to move from one energy level to another, a nucleus either receives or delivers an energy quantum as electromagnetic radiation of a certain frequency. The radiation frequency is determined by the difference between energy levels, which is directly proportional to the strength of the external magnetic field. This frequency associated with exchange of energy is called the Larmor frequency. This exchange of energy between nucleus and environment is called the nuclear magnetic resonance phenomenon. The principles of nclearn magnetic resonance have been dealt with in e.g. the following references: Abragam A: The principles of nuclear magnetism, London Oxford University Press, 1961 and Slichter CP: Principles of magnetic resonance, Berlin, Springer Verlag, 1981.

The nuclear magnetic resonance phenomenon has been studied by so-called continuous radiation (CW, Continuous Wave) and pulse methods. Pulse methods have been found more effective than CW-methods and are thus employed in NMR-spectroscopy and so-called nuclear spin imaging (magnetic resonance imaging, MRI). In pulse methods, a sample is subjected to an electromagnetic pulse of Larmor frequency, whose duration is determined in a manner that the nuclear magnetization of a sample tilts through a desired angle ($\nu$) relative to the direction of the external magnetic field. The amplitude and duration of an electromagnetic pulse are generally selected in a manner that ($\nu$) is a multiple of 90 degrees. Generally used terms are 90-degree and 180-degree pulses etc. The net magnetization $M_n$ deflected from the direction of the external magnetic field $B_o$ after the act of excitation precesses at the Larmor frequency $w_o$ around the direction of $B_o$. This can be established by placing a coil outside a sample in a manner that its magnetic axis is orthogonal to the direction of $B_o$. The precessing net magnetization induces in the coil a so-called FID-signal (Free Induction Decay), which has Larmor frequency and whose amplitude is proportional to the strength of the nuclear magnetization of the sample and to the strength of the external magnetic field.

During the excitation, a nuclear system receives external energy from an excitatary radio-frequency field, and after the excitation, delivers it to its environment. The emission of energy may occur as coherent radiation that can be detected by means of an external coil or energy may be transferred into the structure of a sample as thermal motion. In connection with the delivery of energy, the net magnetization of a sample returns to its equilibrium value. The nature of this process is exponential and characterized by a relaxation time $T_1$. This relaxation time is dependent on the composition of a substance to be examined: e.g. with liquid substances $T_1$ is relatively short (milliseconds to seconds), while with solid substances $T_1$ is long (minutes to weeks). The coherence of radiation emitted by a sample declines after excitation at a rate determined e.g. by the properties of a substance to be examined and by the homogeneity of an external magnetic field. This results in exponential decay of a signal at a rate characterized by a relaxation time $T_2^*$ ($T_2$ star).

$$1/T_2^* = 1/T_2 + \gamma \times \Delta B_o/(2\times\pi), \tag{1}$$

wherein $T_2$ is the spin-spin relaxation time of a sample
$\gamma$ is a gyromagnetic ratio
$\Delta B_o$ is the inhomogeneity of a polarizing magnetic field over a sample.

The relaxation time $T_1\rho$ is analogous to $T_1$ longitudinal relaxation time and is the longitudinal relaxation time in a rotating frame of reference. This frame of reference rotates around the z' axis at the Larmor angular speed. The z' axis coincides with the z axis in the conventional reference frame xyz. The external magnetic field $B_o$ is directed along the z' axis. The effective static field due to the external magnetic field in this frame of reference is zero. The magnetic component of the excitatory RF field appears as a static field along the x axis. In the $T_1\rho$ technique, the nuclear magnetization $M_o$ is tilted 90° from the direction of the external magnetic field by an RF signal. Shortly thereafter, a RF field which has a magnetic component along the tilted magnetization is applied (locking field). The magnetization of the spin system is now locked by the RF field. The nuclear magnetization relaxes toward the thermal equilibrium value corresponding to the strength of the magnetic component of the locking field. Because the magnetic component of the locking field is much smaller than the external field, this equilibrium value is approximately zero. $T_1\rho$ is sensitive to low frequency processes in a sample and $T_1$ is sensitive to processes that are higher in frequency. Because of the greater efficiencies at lower frequencies, $T_1\rho \leq T_1$. All above relaxation times are dependent on the immediate environment of nuclei and its activity. As pointed out above, the physical state of a sample has an effect on relaxation times but also the strength of an external magnetic field and temperature of a sample change relaxation times. The usefulness of the nucleus of a hydrogen atom or the proton in medical diagnostics is based on the abundance of hydrogen in soft tissues, in which it is primarily bound to water molecules. By virtue of its polarity, in turn, a water molecule links itself in various ways to different protein chains and this linkage is altered for a plurality of reasons, e.g. due to a pathological process directed at a tissue. Relaxation times and their alterations have been dealt with in e.g. the following references: R Damadian U.S. Pat. No. 3 789 832 and Nuclear Magnetic Resonance of Intact Biological Systems, Phil Trans R Soc Lond, 289, June 1980.

Interest in utilizing the nuclear magnetic resonance phenomenon in medicine rose in the early 1970s. That was when R. Damadian published his research results, revealing that the relaxation time $T_1$ of a malignant tumour tissue is even twice as long as that of a normal tissue. The publication R. Damadian U.S. Pat. No. 3 789 832 discloses a method for identification of a malignant tumour tissue by comparing the measured relaxation time of a tissue with tabulated relaxation time values and then diagnosing possible malignancy of a specimen. However, later studies have indicated that the changing of relaxation times is not specific of any particular pathological condition. It can be generally concluded, however, that relaxation times change readily due to various ailments and can thus be applied in medical diagnostics. The publication U.S. Pat. No. 3 789 832 also discloses a kind of scanning apparatus for the examination of a human body by means of NMR. However, this prior art solution cannot be regarded as any spin imaging apparatus. The basic idea of nuclear spin imaging was published by PC Lauterbur in 1973 in the reference PC Lauterbur: Nature, 242, 190, 1973. In this publication, he also brought up the idea of mapping a relaxation time $T_1$. Several pulse sequences have been developed for measuring relaxation times, including a so-called Saturation Recovery and Inversion Recovery sequences for measuring $T_1$ and Spin-Echo-sequence for measuring $T_2$. These sequences have been dealt with e.g. in the reference: Farrar TC, Becker ED: Pulse and Fourier Transform NMR-Introduction to Theory and Methods, Academic Press, New York, 1971.

The nuclear spin imaging methods can be roughly classified in three categories: 1. Point imaging, 2. Line imaging and 3. Volume imaging methods. In point imaging techniques, an object area to be examined is mapped by moving the object or a point-like area obtained by various technical means for generating an NMR signal with respect to each other. The main disadvantage of single point techniques is that they are slow and, therefore, they are not applied in medical imaging. With special arrangements, however, the point imaging methods can be used to obtain more tissue information than with e.g. whole volume imaging methods. The single point imaging techniques have been described e.g. in references: Tanaka et al: IEEE, vol. 66, No. 11, 1582–1583, 1978, Damadian: Offenlegungschrift No. 29 46 847, Moore et al: U.S. Pat. No. 4 015 196, Abe: U.S. Pat. No. 3 932 805, Garroway et al: U.S. Pat. No. 4 021 726, Crooks et al: U.S. Pat. No. 4 318 043, Young: UK Pat. Appln GB No. 2 122 753 A. By combining the slow single point imaging technique and rapid ultrasonic imaging technique, as set forth in the reference Sepponen: FI Pat. No. 64282, the single point imaging techniques can be utilized in medical diagnostics.

Line imaging techniques have been described e.g. in the following references: Moore et al: U.S. Pat. No. 4 015 196, Sepponen: FI Pat. No. 58868, Garroway et al: U.S. Pat. No. 4 021 196, Crooks et al: U.S. Pat. No. 4 318 043, Hutchinson et al: U.S. Pat. No. 4 290 019.

The line imaging methods are also too slow for medical imaging and, thus, their application is restricted to certain special cases.

Imaging of a three-dimensional object is most preferably effected by applying whole volume imaging techniques. By means of so-called selective excitation, it is possible to define the object area to be examined from an object and to effect a more accurate mapping of the distribution of NMR parameters. Selective excitation can be effected by exciting over the object a magnetic field gradient orthogonal to the plane of an object area to be excited and by modulating an exciting radio-frequency pulse in a manner that its frequency band width and the gradient field strength correspond to the width of a desired object area. Another method of defining an object area is to utilize a oscillating magnetic field gradient, as set forth in the reference: Moore et al: U.S. Pat. No. 4 015 196. Previously known is also to utilize a gradient in an exciting radio-frequency pulse in a manner that on successive times of excitations the gradient direction is changed, a stable NMR signal being only generated in the plane where the pulse amplitude is constant.

A considerably more inaccurate method is to utilize the geometrical properties of transmitter and receiver coils for defining an object area and, thus, this method has only been applied when it is desired to effect NMR spectroscopic studies of the object. The application of this method has been described in references: Ackerman et al: Nature 283, 167, 1980, Haase et al: J. Magn. Reson. 56, 401–412, 1984, Bottomley et al: Radiology, 150, 441–446, 1984.

Whole volume imaging methods have been described e.g. in references: Lauterbur: Nature, 242, 190–191, 1973, Ernst: U.S. Pat. No. 4 070 611, Hutchinson et al: International Patent application WO No. 81/02788, Sepponen: FI application No. 824343. For speeding up the imaging, it is possible to apply methods disclosed in references: Edelstein et al: GB application No. 2 079 463, Mansfield: U.S. Pat. No. 4 165 479, Hinshaw: Physics Letters 48A, No. 2, June 3, 87–88, 1974, Likes: U.S. Pat. No. 4 307 343. Particularly noteworthy nuclear spin imaging methods are so-called Fourier imaging methods, one version of which has been set forth in the reference Ernst: U.S. Pat. No. 4 070 611. A drawback in this cited method is the collection of an FID-signal generated after the excitation pulse. Encoded in the phase of a collected FID-signal is the position information of one or two perpendicular directions by means of gradient pulses of constant amplitudes but varying durations. A drawback in this method is e.g. that the moment of pick-up changes on various signal pick-up times, resulting in the method's sensitivity to the inhomogeneities of a polarizing magnetic field $B_o$ and, thus, $T_2$ of a sample or specimen also affects the signal to be picked up. The reference Hutchison et al: WO No. 81/02788 discloses a variation of Fourier imaging technique for generating a sort of spin echo by changing the magnetic field gradient direction. This spin echo is stored and its phase is encoded with a gradient pulse orthogonal to the direction of a read-out gradient, the amplitude of said gradient pulse being varied on various repetition cycles. A more preferred way of generating a spin echo is to compensate the effect of the basic field inhomogeneities on a final image. Applications of this method have been described in references: Edelstein et al: EP 91008, Bottomley et al: EP 98426, Hutchison et al: Proceedings of 18th Ampere Congress, Nottingham, 1974, 283...284 and Sepponen: FI Appln. No. 824343 corresponding to U.S. Pat. Application No. 561,339, filed Dec. 13, 1983, now U.S. Pat. No. 4,654,594 of Mar. 31, 1987. The reference Brunner P: Journal of Mag. Res. 33, 83–106, (1979) discloses how to speed up the examination of a three-dimensional object with nuclear spin imaging techniques by directing the excitation and detection phases in temporal succession at various parts of an object. This serves to avoid a long duration of the examination caused by the nuclear system recovery time.

At present, nuclear spin imaging is primarily used for mapping the hydrogen distribution of an object and the distributions of the relaxation times $T_1$ and $T_2$ of a nucleus. On the other hand, methods applicable to the mapping of relaxation time $T_1\rho$ have not been published. The method of the invention and the apparatus for carrying out the method are used for mapping the distribution of relaxation time $T_1\rho$ of an object, such as a human body, trunk of a tree or a nutritive substance.

BRIEF DESCRIPTION OF THE DRAWING

The method of the invention and an apparatus associated therewith are described with reference to the accompanying drawings, in which.

DETAILED DESCRIPTION OF THE PREFERRED EMBODIMENT

Figure 1:
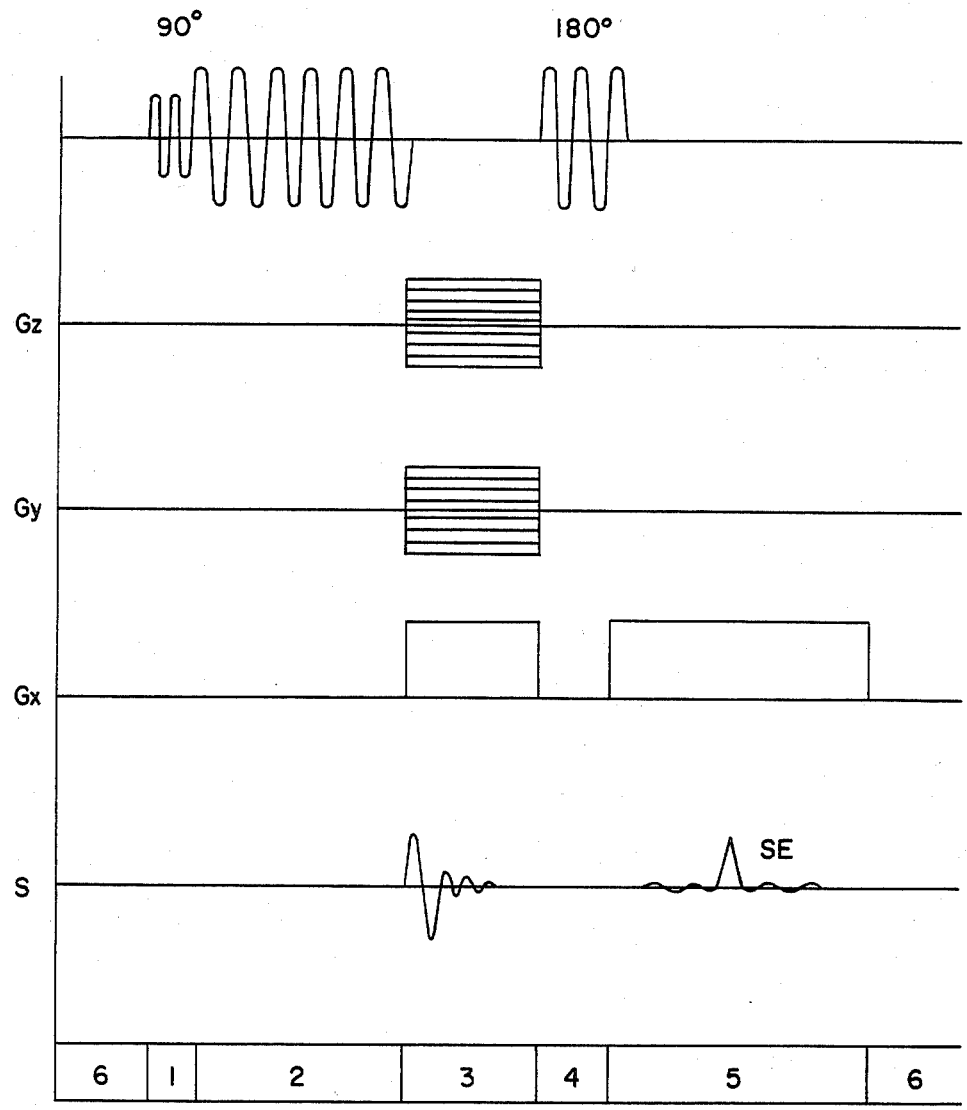
FIG. 1 illustrates the application of a method of the invention in conjunction with Fourier imaging techniques.

Application of the invention by utilizing so-called Fourier imaging techniques is possible, as shown e.g. in FIG. 1. Thus, an object is excited preferably by using a so-called 90° pulse (phase 1 in FIG. 1), immediately after the excitation pulse the object being subjected to a resonance frequency pulse, phase shifted +90 or −90 degrees with respect to the phase of the excitation pulse, the amplitude of said resonance frequency pulse being selected in a manner that the phase of precessing nuclei is locked in the phase of the pulse. This means that the size of a magnetic component in the pulse substantially exceeds the inhomogeneities of a polarizing magnetic field or the inherent magnetic inhomogeneities of a substance to be examined. The pulse duration is selected in a manner that a desired degree of the nuclear system relaxation in the direction of a rotating magnetic field has time to proceed for generating a desired tissue contrast (phase 2). During the pulse, the nuclear magnetization undergoes relaxation according to the following equation:

$$M_T = M_{TO} \exp(-t/T_1\rho)$$

Since the relaxation time $T_1\rho$ values characteristic of various tissues differ from each other, the effect of said differences can be applied to the intensity of a signal being recorded. In order to find the local distribution of relaxation time, according to Fourier imaging techniques, it is necessary to encode the position information in the initial phase of a signal to be recorded by means of a magnetic field gradient pulse (phase 3), whose amplitude, or rather time integral, is changed between various excitation and signal pick-up cycles. For generating a spin echo, a so-called refocusing pulse (preferably a so-called 180° pulse) should be directed at an object (phase 4). For the duration of signal collection, a so-called read-out gradient is switched over an object and a created spin echo SE is recorded. A time delay between phases 3 and 5 should be kept short compared to relaxation times $T_2$ of the object area materials, so that spin-spin relaxation does not have a deteriorating effect on the contrast depending on $T_1\rho$. Effect of the inhomogeneities of a polarizing magnetic field on a produced image can be minimized by selecting the sequence timings so that the temporal distances of the outset instant of phase 3 and the midway point of phase 5 from the temporal midway point of said 180-degree pulse are equal. The described pulse sequence is repeated as many times as necessary for collecting the information required for producing an image, and the delay between repetitions is described by phase 6.

Figure 2:
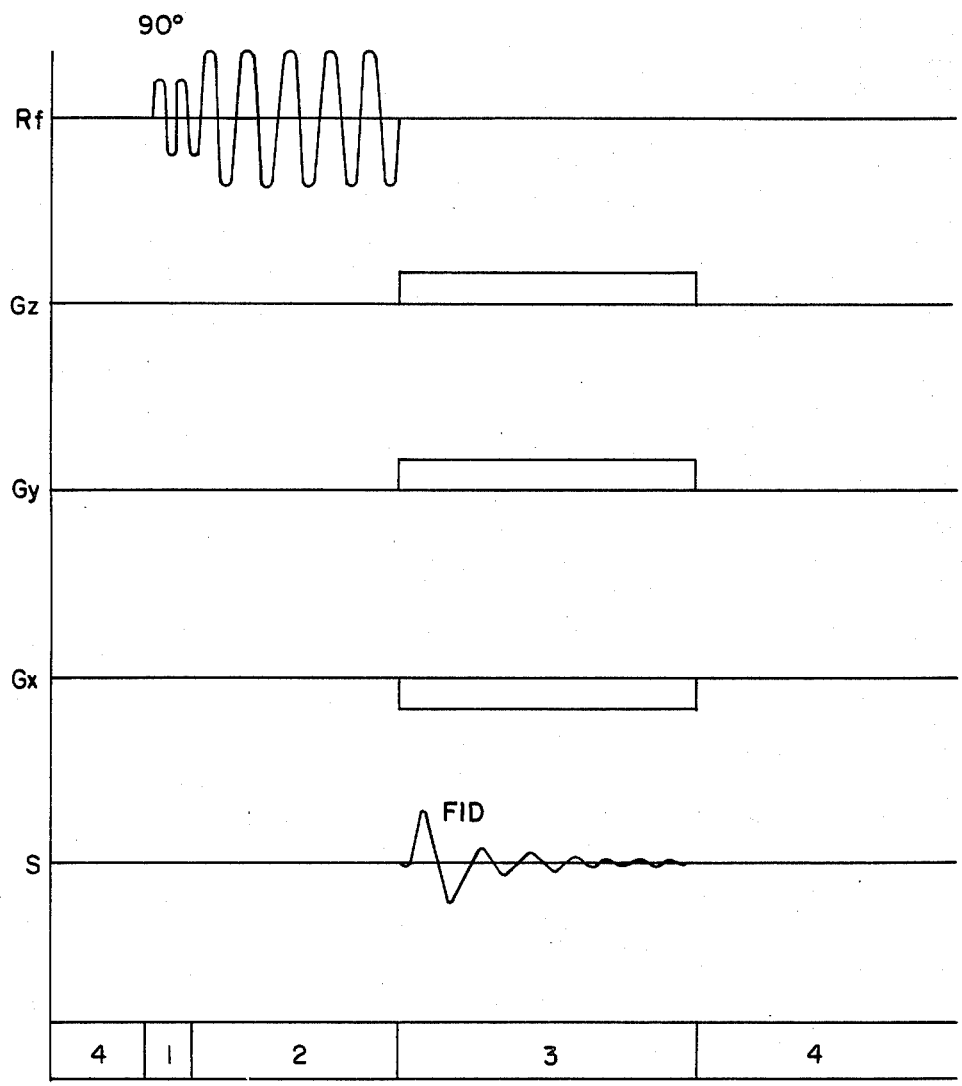
FIG. 2 illustrates the application of a method of the invention in conjunction with projection-reconstruction.

FIG. 2 is a diagrammatic representation of the application of the method of the invention in conjunction with a so-called projection-reconstruction technique. In the illustrated case, the object is first excited preferably by means of a 90-degree pulse (phase 1) and thereafter the nuclear system is allowed to relax in the above-described manner under the action of a locking signal (phase 2). A produced FID signal is registered under the influence of a magnetic field gradient of a desired direction (phase 3). By effecting a Fourier transformation on the registered signal, a projection of the object is obtained with respect of the direction of said magnetic field gradient. This action sequence is repeated at certain time intervals (phase 4) at the same time changing the direction of said registering gradient until a sufficient number of projections are collected for reconstructing the internal distribution of an object. An advantage gained by this method is that the signal is not for markedly affected by the spin-spin relaxation of an object.

Figure 3:
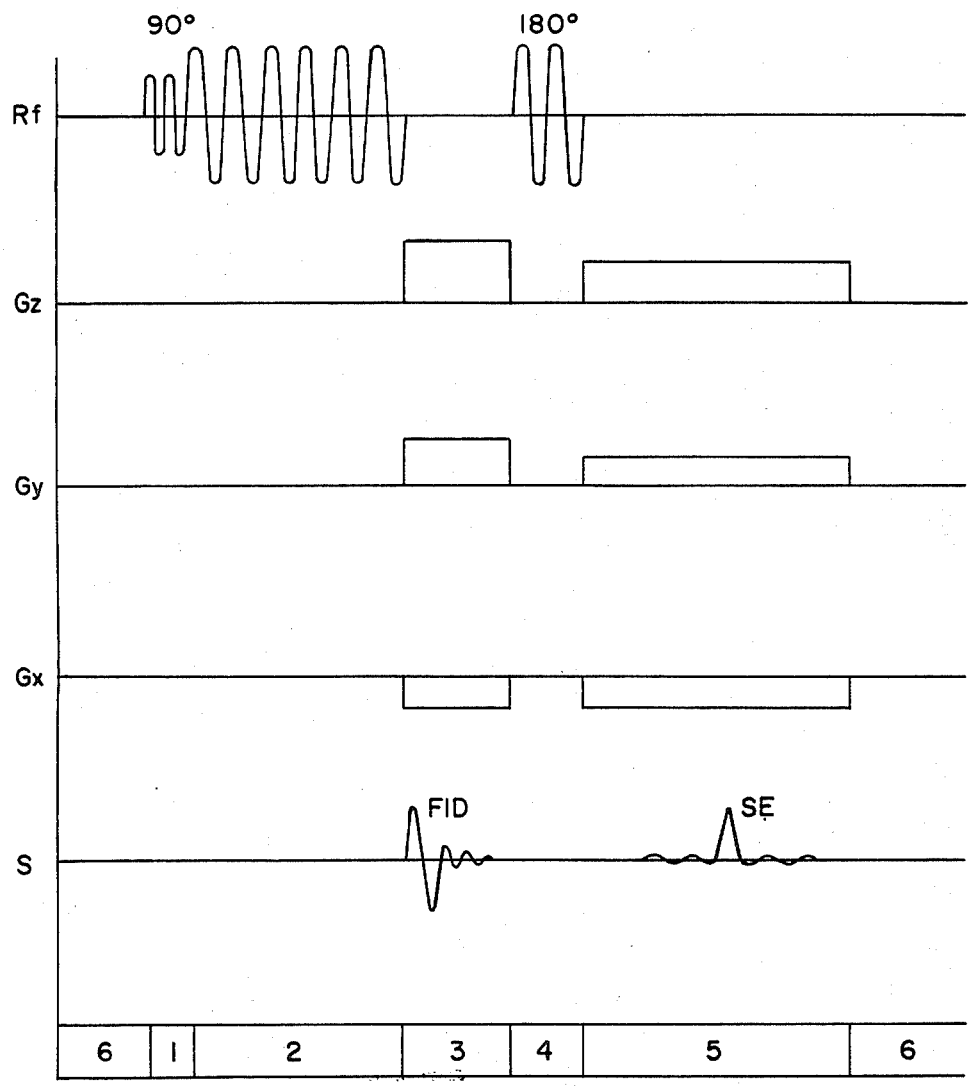
FIG. 3 illustrates the application of the method in conjunction with projection-reconstruction for generating a so-called spin echo.

FIG. 3 illustrates the application of the method of the invention in conjunction with a projection-reconstruction technique by utilizing a spin echo.

Figure 4:
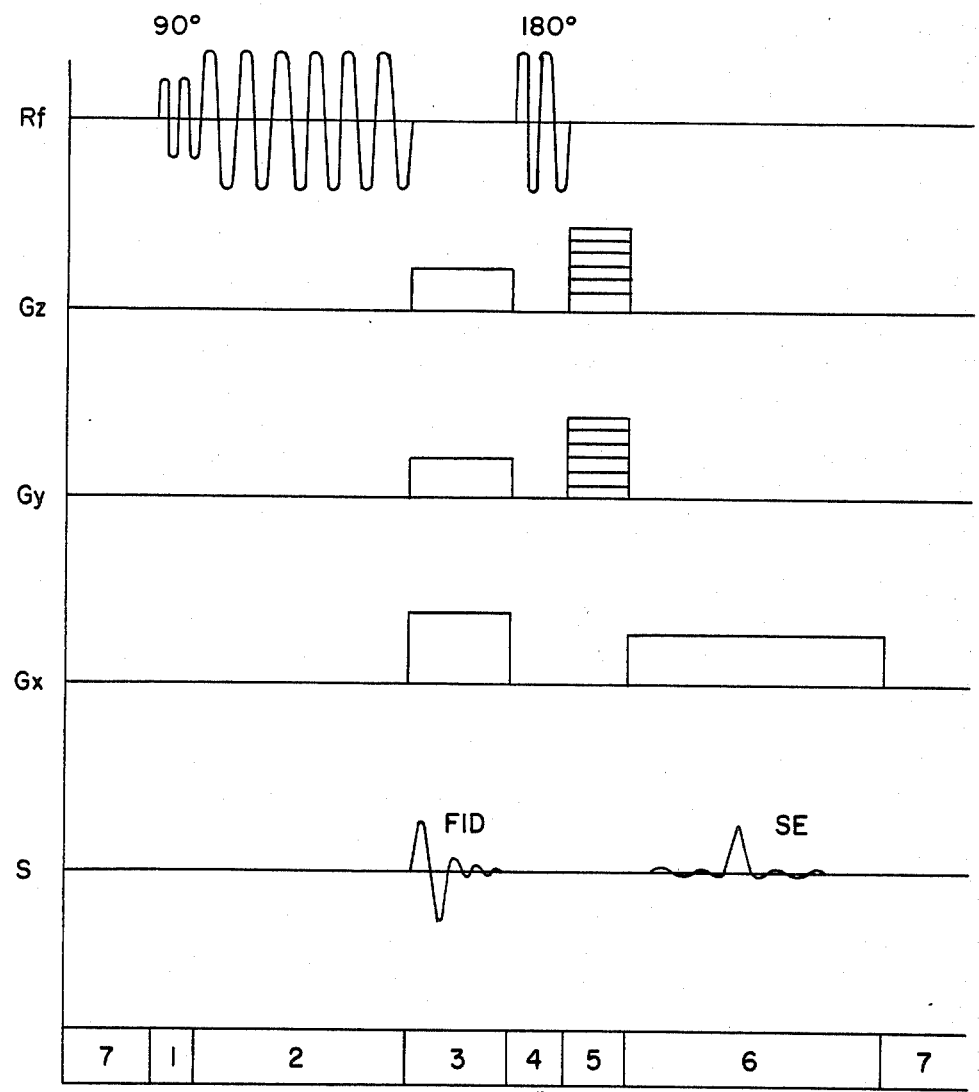
FIG. 4 illustrates the application of the method in conjunction with a technique set forth particularly in the reference Sepponen: FI Appl. No. 824343.

FIG. 4 illustrates application of the invention as set forth in the reference Sepponen FI Appln. No. 824343, corresponding to U.S. Pat. No. 4,654,594 by only utilizing unipolar gradient pulses.

Figure 5:
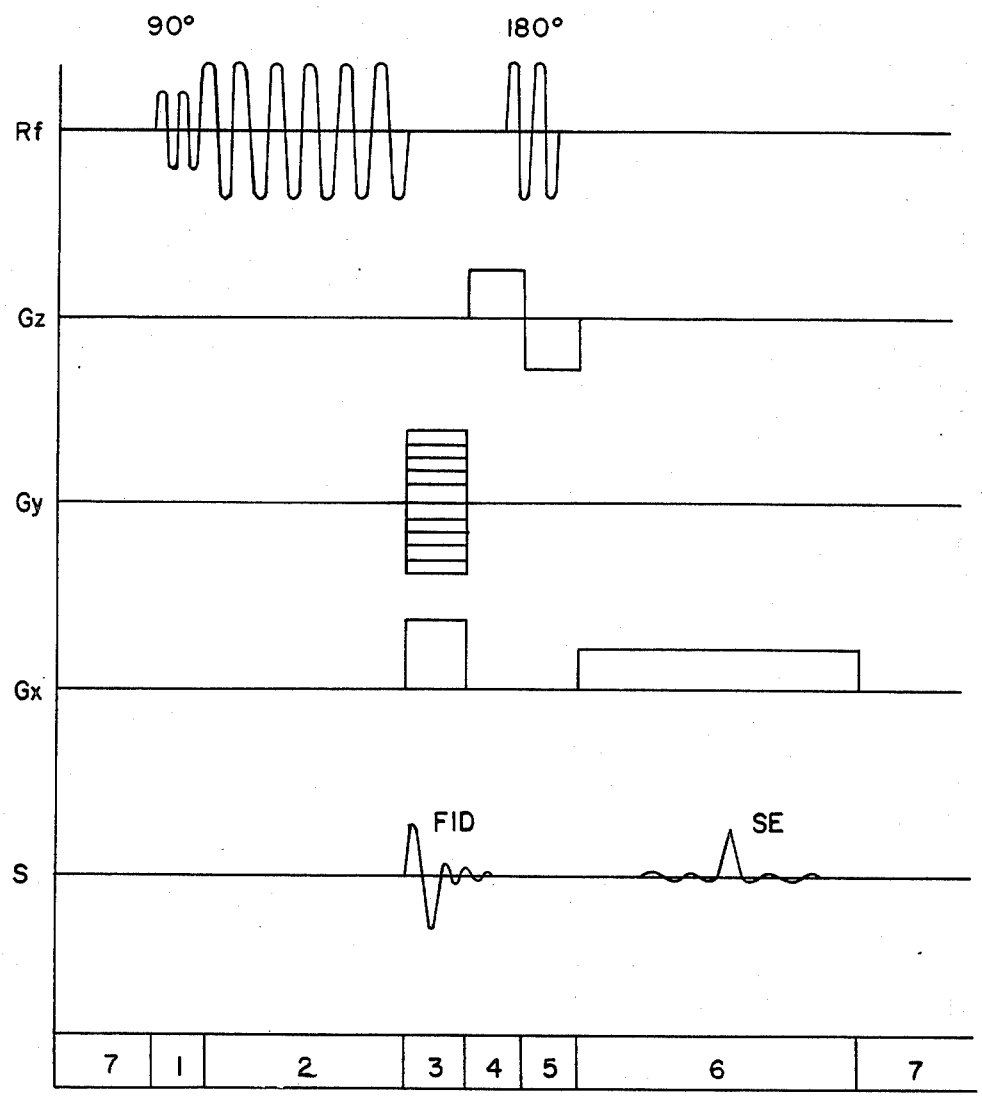
FIG. 5 illustrates such application of the method, in which only a slice-shaped area of an object is to be mapped.

FIG. 5 illustrates the method of the invention that is applied when the purpose is to image just a slice-shaped area of a three-dimensional object. In this application, either said 90-degree excitatory pulse or said echo-forming 180-degree pulse or both are selective, in other words, during the duration thereof, over the object is switched a magnetic field gradient whose direction is perpendicular to the plane of a slice to be imaged.

Application of the invention is by no means limited to the above embodiments but a plurality of variations of the invention are conceivable within the scope of the annexed claims.

I claim:

1. A method for determining the spatial distribution of an NMR responsive substance in a selected volume of an object to be examined and the relaxation time in the rotating frame of reference ($T_1\rho$) of nuclei of the substance, said method comprising the steps of:

applying an external magnetic field to the selected volume of the object;

exciting the nuclei in the selected volume of the object by a first electromagnetic pulse for generating a nuclear magnetization in the selected volume transverse to the direction of the external magnetic field;

applying a second electromagnetic pulse to the selected volume, said second pulse being oscillatory and having a phase selected such that the magnetic component of the pulse is directed parallel to the direction of the precessing transverse nuclear magnetization, the relaxation obtained during this second pulse occurring in a rotating reference frame and being characterized by the relaxation time $T_1\rho$;

applying magnetic field gradient pulses sequenced with said electromagnetic pulses in accordance with a selected magnetic resonance imaging technique;

collecting the NMR signals from said selected volume related to the density of the nuclei and to the relaxation in the rotating reference frame ($T_1\rho$);

repeating the foregoing steps; and constructing a map containing relaxation time in the rotating frame ($T_1\rho$) data.

2. The method as set forth in claim 1 wherein the step of the applying said first pulse is defined as applying a pulse for tilting the nuclear magnetization 90° from the direction of the external magnetic field.

3. A method as set forth in claim 1 further defined in that the sequence of steps is repeated with second pulses of different durations for constructing a map of the spatial distribution of the relaxation time in the rotating frame ($T_1\rho$).

4. A method as set forth in claim 1 further defined in that the sequence of steps is repeated and wherein the step of applying the magnetic field gradient pulses is further defined as changing the direction of the magnetic field gradient pulses during repetitions of the sequence of steps.

5. A method as set forth in claim 3 further defined in that the sequence of steps is repeated and wherein the step of applying the magnetic field gradient pulses is further defined as changing the direction of the magnetic field gradient pulses during repetitions of the sequence of steps.

6. A method as set forth in claim 1 further defined in that the sequence of steps is repeated and wherein the step of applying the magnetic field gradient pulses is further defined as applying the magnetic field gradient pulses prior to collecting the NMR signals for a period of time, the gradient pulses having a time integral dependent on the amplitude of the gradient and the length of said time period, and wherein during repetitions of the steps of the method, the time integral of the magnetic field gradient pulses is altered.

7. A method as set forth in claim 3 further defined in that the sequence of steps is repeated and wherein the step of applying the magnetic field gradient pulses is further defined as applying the magnetic field gradient pulses prior to collecting the NMR signals for a period of time, the gradient pulses having a time integral dependent on the amplitude of the gradient and the length of said time period, and wherein during repetitions of the steps of the method, the time integral of the magnetic field gradient pulses is altered.

8. A method as set forth in claim 1 further defined as applying a refocusing electromagnetic field pulse or reversing the direction of the magnetic field gradient produced by said magnetic field gradient pulses for providing a spin-echo signal and as collecting said spin-echo signals as said nuclear magnetic resonance signals.

* * * * *